(12) United States Patent
Pinna et al.

(10) Patent No.: US 9,407,224 B2
(45) Date of Patent: Aug. 2, 2016

(54) DIGITAL MICROPHONE DEVICE WITH EXTENDED DYNAMIC RANGE

(71) Applicant: STMicroelectronics International N.V., Schiphol (NL)

(72) Inventors: Carlo Pinna, Milan (IT); Alessandro Mecchia, Vimercate (IT); Paolo Pesenti, Milan (IT)

(73) Assignee: STMicroelectronics International N.V., Geneva (CH)

( * ) Notice: Subject to any disclaimer, the term of this patent is extended or adjusted under 35 U.S.C. 154(b) by 87 days.

(21) Appl. No.: 14/311,086

(22) Filed: Jun. 20, 2014

(65) Prior Publication Data

US 2014/0334643 A1 Nov. 13, 2014

Related U.S. Application Data

(63) Continuation of application No. PCT/EP2012/076258, filed on Dec. 20, 2012.

(60) Provisional application No. 61/579,978, filed on Dec. 23, 2011.

(30) Foreign Application Priority Data

Dec. 22, 2011 (EP) ..................................... 11195374

(51) Int. Cl.
*H03G 3/20* (2006.01)
*H04R 3/04* (2006.01)
(Continued)

(52) U.S. Cl.
CPC ................. *H03G 3/20* (2013.01); *H03G 3/301* (2013.01); *H04R 1/005* (2013.01); *H04R 1/04* (2013.01); *H04R 3/04* (2013.01); *H04R 2499/11* (2013.01)

(58) Field of Classification Search
None
See application file for complete search history.

(56) References Cited

U.S. PATENT DOCUMENTS

| | | |
|---|---|---|
| 6,160,448 A | 12/2000 | Werrbach |
| 2003/0012391 A1 | 1/2003 | Armstrong et al. |

(Continued)

FOREIGN PATENT DOCUMENTS

| | | |
|---|---|---|
| EP | 1 753 130 A1 | 2/2007 |
| WO | 01/78446 A1 | 10/2001 |

OTHER PUBLICATIONS

Baker, Bonnie. "How delta-sigma ADCs work." Texas Instruments Incorporated, Analog Applications Journal (2011).*

(Continued)

*Primary Examiner* — Curtis Kuntz
*Assistant Examiner* — Kenny Truong
(74) *Attorney, Agent, or Firm* — Seed IP Law Group PLLC

(57) ABSTRACT

The present disclosure refers to a digital microphone device providing a single-bit Pulse Density Modulation PDM output signal. The digital microphone comprises a microphone, arranged to convert an acoustic input signal into an analog electrical signal, and a preamplifier, having a variable gain, arranged to receive the analog electrical signal and to provide an amplified analog electrical signal, depending on the variable gain. The variable gain depends on a gain control signal. The digital microphone further comprises an Analog-to-Digital Converter block, arranged to receive the amplified analog electrical signal and to convert it into a respective digital signal; and a compensation block, arranged to receive the digital signal and to perform a digital operation on such digital signal, on the basis of a compensation signal, to generate a compensated signal. Furthermore, the digital microphone comprises an Automatic Gain Controller block 25, arranged to detect the digital signal and to generate said gain control signal, on the basis of the detected digital signal. The Automatic Gain Controller block is further arranged to generate the compensation signal, on the basis of the control signal, and to provide the compensation signal to the compensation block, to compensate a variation of the digital signal resulting from the variable gain of the preamplifier. Finally, the digital microphone device comprises a conversion block, arranged to receive the compensated signal and to convert it into the single-bit PDM output signal.

20 Claims, 5 Drawing Sheets

(51) Int. Cl.
*H04R 1/00* (2006.01)
*H03G 3/30* (2006.01)
*H04R 1/04* (2006.01)

(56) References Cited

U.S. PATENT DOCUMENTS

| | | |
|---|---|---|
| 2005/0207596 A1 | 9/2005 | Beretta et al. |
| 2006/0229028 A1 | 10/2006 | Somayajula |
| 2007/0127761 A1* | 6/2007 | Poulsen ............... H03M 7/3015 381/355 |
| 2009/0161888 A1 | 6/2009 | Okada |
| 2011/0033056 A1 | 2/2011 | Johnson et al. |
| 2011/0130176 A1* | 6/2011 | Magrath ............... G10K 11/178 455/570 |
| 2012/0328129 A1* | 12/2012 | Schuurmans ......... H03M 1/183 381/122 |
| 2014/0140538 A1* | 5/2014 | Kropfitsch ............. H03G 3/002 381/106 |
| 2014/0185832 A1* | 7/2014 | Schober ................. H03G 3/301 381/107 |

OTHER PUBLICATIONS

Deligoz et al., "A MEMS-Based Power-Scalable Hearing Aid Analog Front End," *IEEE Transactions on Biomedical Circuits and Systems* 5(3):201-213, Jun. 2011.

ASIC Advantage, Inc., "Aai Announces the AAP349 Variable Gain Digital Microphone Pre-Amplifier," May 28, 2010, <http://www.asicadvantage.com/content/view/147/133/>, accessed Jun. 9, 2011, 2 pages.

* cited by examiner

FIG. 1 - PRIOR ART

DIGITAL MICROPHONE DEVICE WITH EXTENDED DYNAMIC RANGE

BACKGROUND

1. Technical Field

The present disclosure relates to digital microphone devices and in particular to a digital microphone device with extended dynamic range. More specifically, the disclosure refers to an extended dynamic range digital microphone device providing a single-bit Pulse Density Modulation output signal.

2. Description of the Related Art

Digital microphone devices have recently emerged as an advantageous solution, especially for applications related to mobile phone devices.

Traditionally, inside mobile phones or other electronic equipment, the microphones have been inserted as separate components and connected to the other printed circuit boards (PCBs) of the mobile phone device through mechanical systems (e.g., springs, mechanical pressure, etc.). Analog paths were provided on the printed circuit boards, in order to connect the microphones to the analog-to-digital conversion path.

More recently a new approach is being used, with the microphone suppliers providing a complete system, that includes the microphone itself and the whole analog-to-digital conversion system, in one package with a standard pin configuration. Such complete microphone system is commonly referred to as "digital microphone device" or "digital microphone" or even "digital microphone system".

In order to satisfy the requirements of a multi-vendor environment, such as for mobile phones, digital microphones must comply with well defined standards, which impose strict constraints.

One of the relevant constraints is that digital microphones are boxed in a single package with a limited and pre-defined number of pins.

Typically, four pins only are available: two pins for supply, one pin for the clock of the digital microphone (e.g., at 2.4 MHz), and one data output pin, through which output digital data are provided.

Such output digital data are in the form of single-bit Pulse Density Modulated (PDM) signal.

FIG. 1 shows a digital microphone according to the known art. The system in FIG. 1 includes a microphone 11, with its biasing circuit 17, a preamplifier 12 and a single-bit Sigma-Delta Analog-to-Digital Converter (ΣΔ ADC) 13. The ΣΔ ADC is a widely used Analog-to-Digital Converter capable of providing Pulse Density Modulation. The digital output of the ΣΔ ADC is the output signal which is sent to the one data output pin.

For example, the ΣΔ ADC can be a $4^{th}$ order ΣΔ modulator, configured to generate a single-bit PDM digital signal.

The prior art digital microphone shown in FIG. 1 has four pins only 101-104, according to the already mentioned typical configuration of such systems.

This implies, in particular, that no pins are available for input and/or output control signals, e.g., signals to be used for controlling the internal operation of the digital microphone through external control devices.

Several drawbacks derive from such standard configuration.

The fact that no external control is possible, as mentioned above, implies in particular that it is not possible to implement an external control of the internal path gain of the digital microphone.

For this reason, digital microphone devices, according to the prior art, comprise preamplifiers with fixed gain, and hence have a fixed path gain.

The fact that the path gain is fixed, on its turn, implies that the overall dynamic range of the digital microphone system is limited by the analog to digital conversion path noise.

In particular, in the known systems, there is no possibility to optimize the dynamic range of the microphone system by acting on the microphone preamplifier gain.

The resulting poor performances, in terms of limited dynamic range, are considered to be a major drawback.

Therefore, in the considered technical field, an urgent need for improved digital microphone devices is emerging. In particular, it is required to devise and implement digital microphone devices characterized by an extended dynamic range, with respect to the currently available systems, while still complying to the mentioned constraints, imposed, e.g., by standards.

BRIEF SUMMARY DISCLOSURE

The present disclosure is to provide a digital microphone device with extended dynamic range, which is alternative to the ones of the cited prior art, in such a way to overcome at least partially the above drawbacks and limitations.

In particular, the present disclosure is directed to a digital microphone device with internal gain control capabilities, such as to guarantee an extended dynamic range, with respect to known systems, while complying to the constraints due to the limited number of available pins, and to the requirement of providing a single-bit PDM output signal.

A digital microphone device according to the disclosure, providing a single-bit Pulse Density Modulation PDM output signal, comprises: a microphone arranged to convert an acoustic input signal into an analog electrical signal; a preamplifier, having a variable gain, on the basis of a gain control signal, the preamplifier being arranged to receive the analog electrical signal and to provide an amplified analog electrical signal, depending on the variable gain; an Analog-to-Digital Converter block, arranged to receive the amplified analog electrical signal and to convert it into a respective digital signal; a compensation block, arranged to receive the digital signal and to perform a digital operation on such digital signal, on the basis of a compensation signal, to generate a compensated signal; an Automatic Gain Controller block, arranged to detect the digital signal and to generate said gain control signal, on the basis of the detected digital signal; the Automatic Gain Controller block being further arranged to generate said compensation signal, on the basis of the control signal, and to provide the compensation signal to the compensation block, to compensate a variation of the digital signal resulting from the variable gain of the preamplifier; a conversion block, arranged to receive the compensated signal and to convert it into the single-bit PDM output signal.

An embodiment of the disclosure is directed to a method for providing a single-bit Pulse Density Modulation PDM output signal at an output of a digital microphone device, which comprises the step of: converting, by means of a microphone, an acoustic input signal into an analog electrical signal; amplifying said analog electrical signal, by means of a preamplifier having a variable gain depending on a gain control signal, to generate an amplified analog electrical signal, depending on the variable gain; converting, by means of an Analog to Digital Converter block, the amplified analog electrical signal into a respective digital signal; detecting, by means of an Automatic Gain Controller block, said digital signal; generating, by the Automatic Gain Controller block, said gain control signal, on the basis of the detected digital signal, and providing the gain control signal to the pre-amplifier; further generating, by the Automatic Gain Controller block, a compensation signal, on the basis of the control signal, and providing the compensation signal to a compensation block; compensating, by means of the compensation block, a variation of the digital signal, resulting from the variable gain of the preamplifier, by performing a digital operation on the digital signal, on the basis of said compensation signal, so as to generate a compensated signal; converting, by means of a conversion block, the compensated signal into the single-bit PDM output signal.

BRIEF DESCRIPTION OF THE SEVERAL VIEWS OF THE DRAWINGS

The characteristics and the advantages of the present digital microphone device will be better understood from the following detailed description of one embodiment thereof, which is given by way of illustrative and non-limiting example with reference to the annexed drawings, in which.

DETAILED DESCRIPTION

Diagrams of preferred embodiments of a digital microphone device according to the disclosure can be described with reference to FIGS. 2-4.

Figure 1:
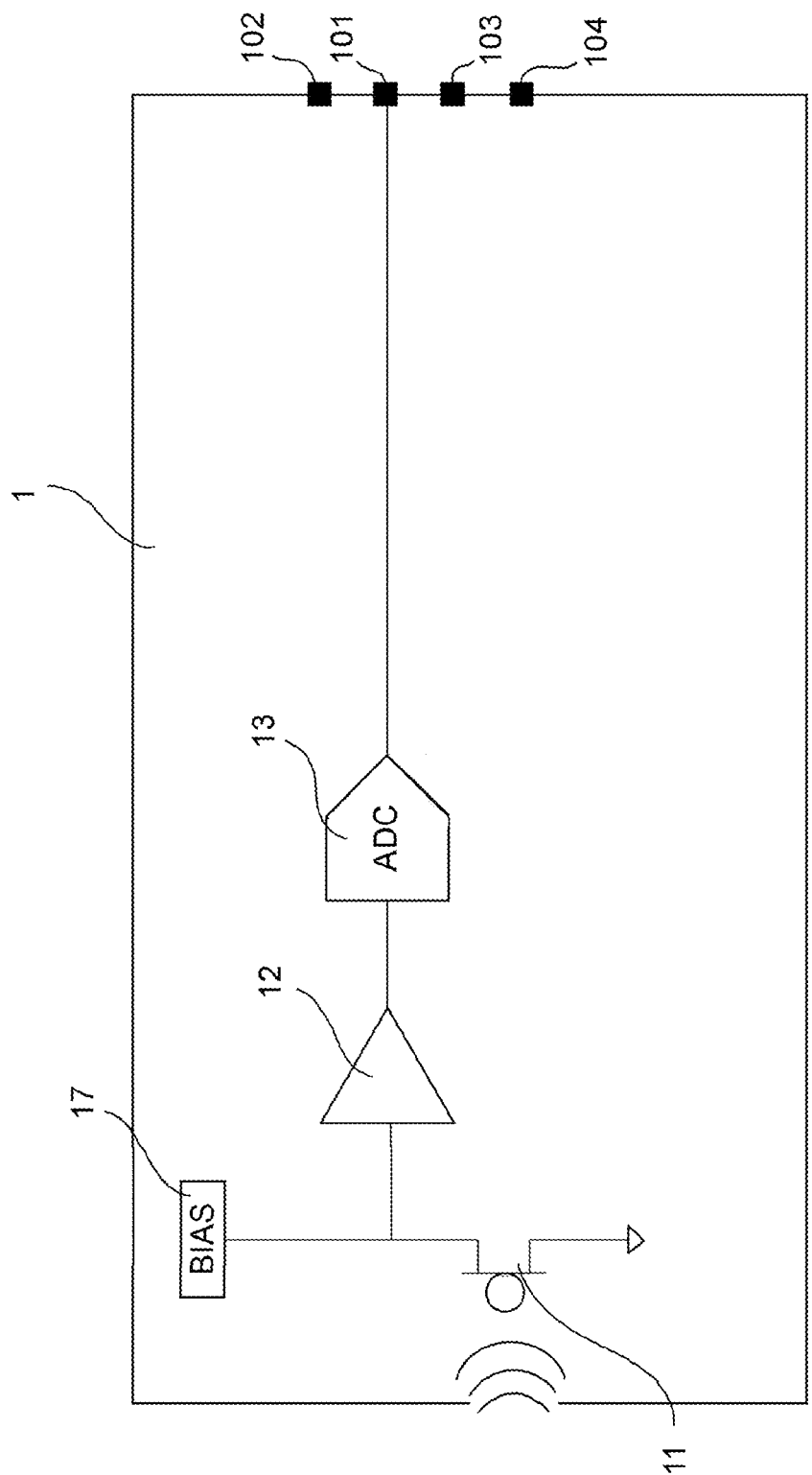
FIG. 1 shows a block diagram of a digital microphone device according to the prior art.
Figure 2:
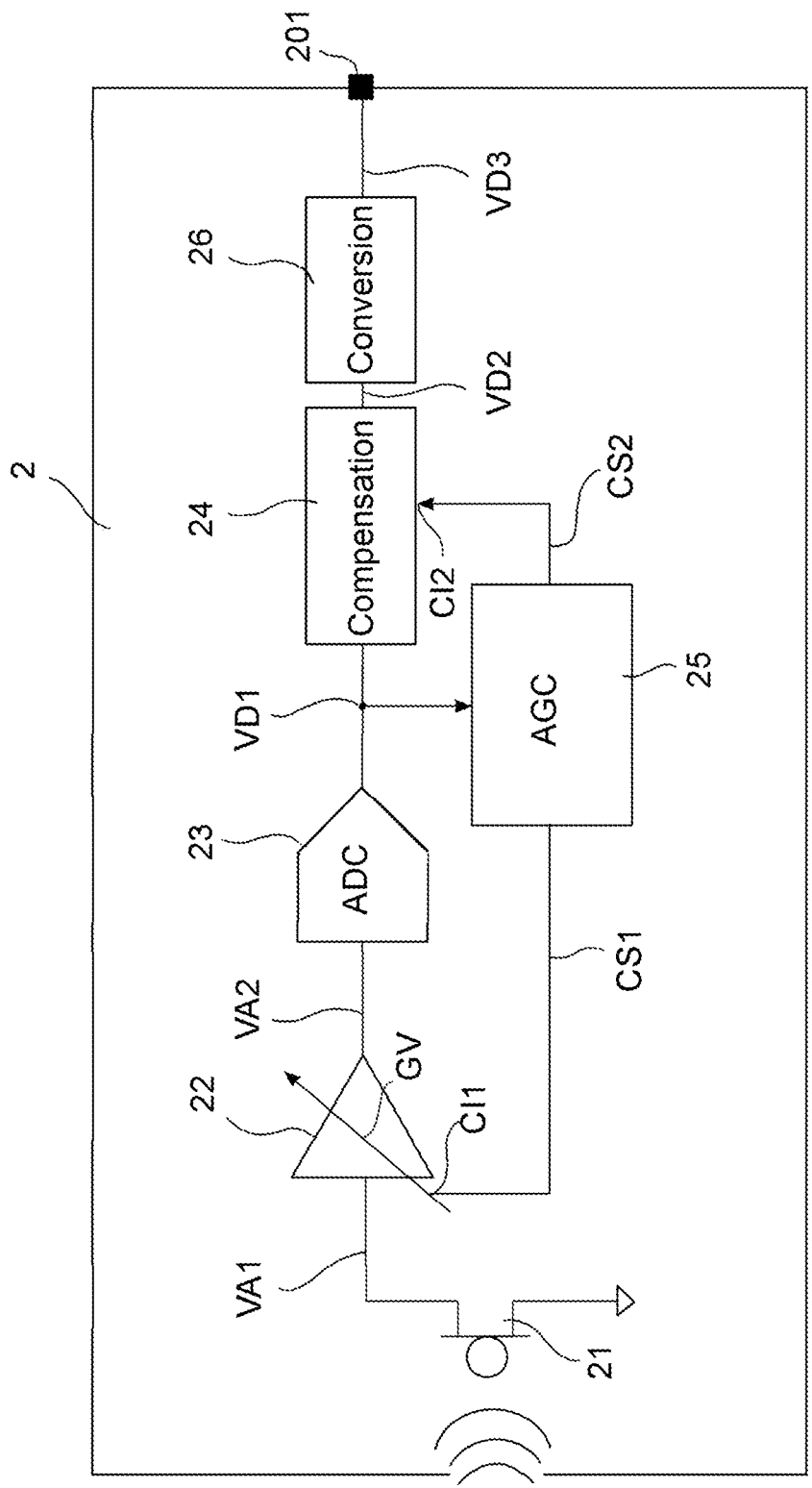
FIG. 2 shows a high-level functional block diagram of a digital microphone device according to the present disclosure.
Figure 3:
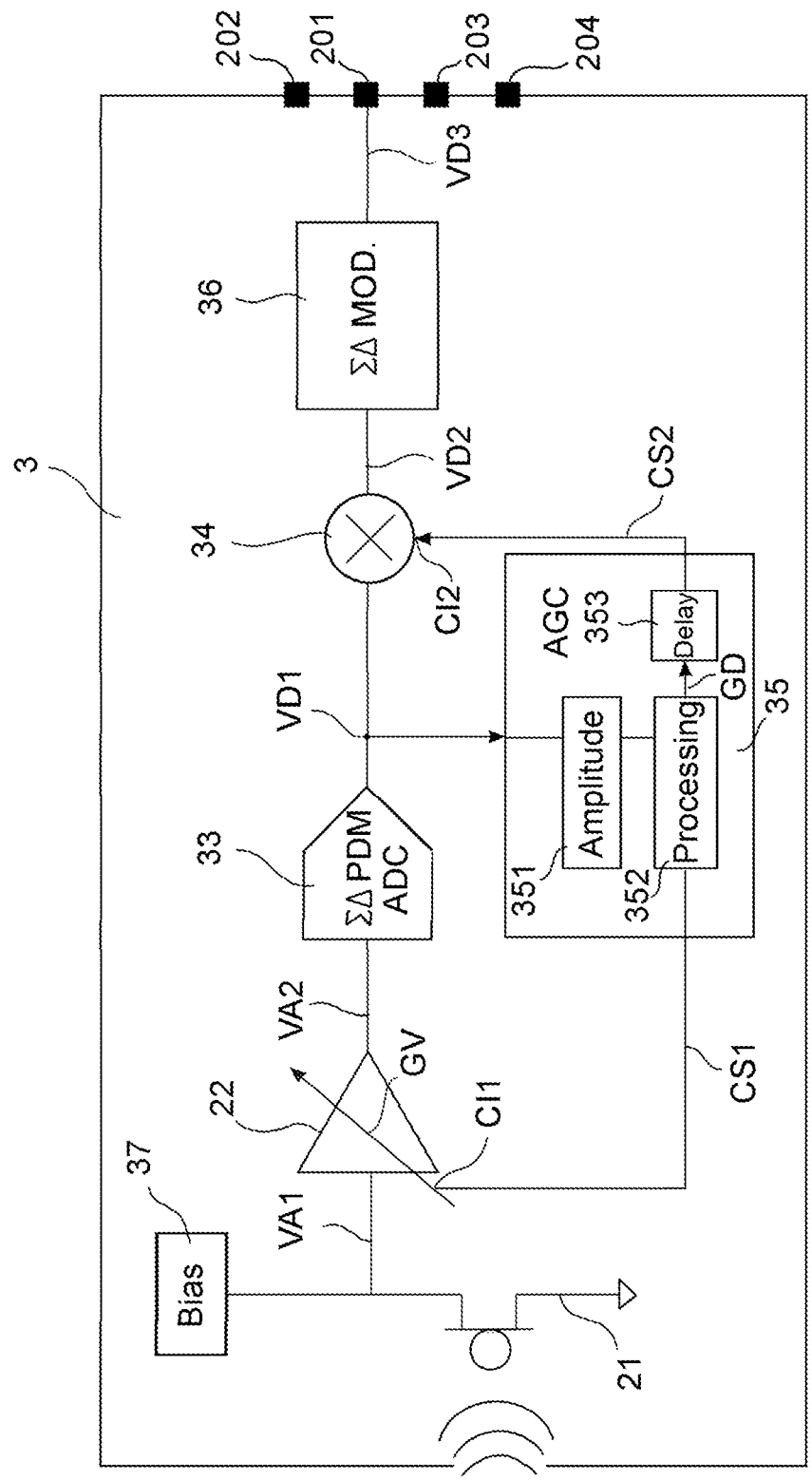
FIG. 3 and FIG. 4 show more detailed block diagrams of different embodiments of a digital microphone device according to the disclosure.
Figure 4:
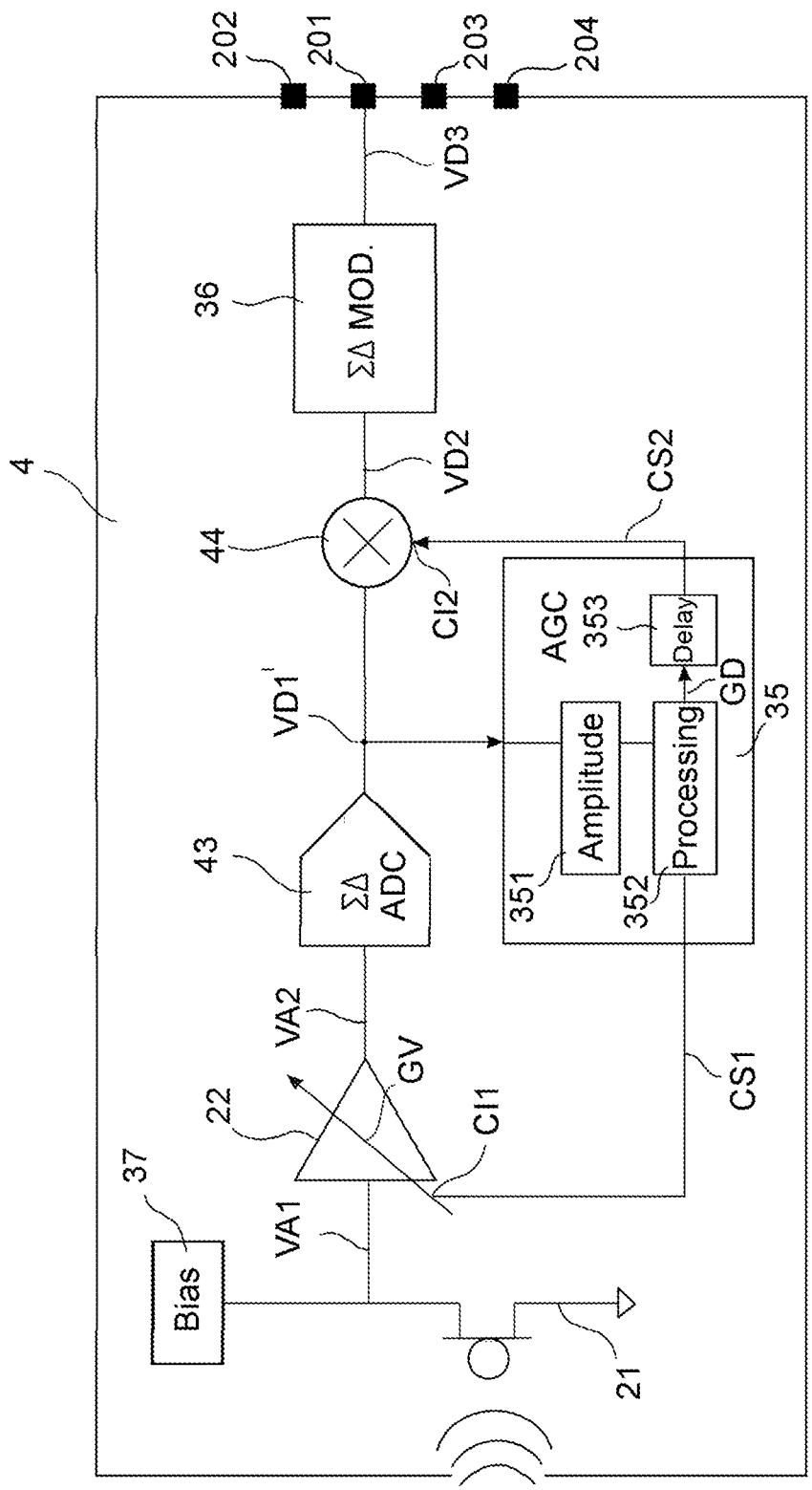

In particular, FIGS. 2-4 relate to a digital microphone device arranged to provide a single-bit Pulse Density Modulation (PDM) output signal, which is a typical feature for such a type of device.

With reference to FIG. 2, the digital microphone device 2 (or, simply, digital microphone 2) comprises a microphone 21, arranged to convert an acoustic input signal into an analog electrical signal VA1.

The digital microphone 2 further comprises a preamplifier 22, arranged to receive and amplify the analog electrical signal VA1, so as to obtain an amplified analog electrical signal VA2.

The preamplifier 22 is a variable-gain preamplifier, having a variable gain GV. The variations of the gain GV are controlled by, and depend on, a gain control signal CS1, which is available at a control input CI1 of the preamplifier 22.

More specifically, the variable gain GV may be expressed according to the equation:

$$GV = GF * GA \quad (1)$$

wherein GF is a fixed gain, and GA is an analog gain factor, corresponding to a respective value of the gain control signal CS1.

The fixed gain GF value is defined, while designing the digital microphone, in order to have an output signal compliant with certain requirements, which are to be respected by the digital microphone manufacturer. Such fixed gain GF can be seen as a nominal value, equivalent to the gain of fixed-gain preamplifier present in digital microphones of the prior art.

The variable gain GV may vary in a range of, for example, 0 to 30 dB.

Advantageously, the preamplifier 22 is a low noise amplifier having, e.g., an input equivalent noise of 2 μV.

With reference again to FIG. 2, the digital microphone device 2 further comprises an Analog-to-Digital Converter block 23 (or, simply, ADC block 23), operatively connected to the preamplifier 22 to receive the amplified analog electrical signal VA2 and to convert it into a respective digital signal VD1. The ADC block may be of different types: according to the type of ADC block, a respective different ADC conversion technique is implemented. Some examples of ADC blocks will be illustrated with more details in the following, while describing FIGS. 3 and 4.

Typically, the ADC block can convert input analog signals having a value range up to approximately 1 V.

It should be noted that, whichever ADC technique is performed by the ADC block, the digital signal VD1 depends on the amplitude (varying in time) of the amplified analog electrical signal VA2. Thus, the digital signal VD1 will also depend on the variations imposed to the amplitude of the amplified analog signal VA2 by the preamplifier 22, because of its variable gain GV.

Therefore, the digital signal VD2 shows a variation, in time, resulting from the variable gain GV of the preamplifier 22.

Considering again FIG. 2, it can be seen that the digital microphone device 2 also comprises a compensation block 24, operatively connected to the ADC block 23 to receive the digital signal VD1, and arranged to perform a digital operation on such digital signal VD1, in order to generate a digital compensated signal VD2. The digital operation is performed by the compensation block 24 on the basis of (i.e., depending on) a compensation signal CS2, which is available at a control input CI2 of the compensation block 24.

Furthermore, the digital microphone device 2 comprises an Automatic Gain Controller block 25 (or, simply, AGC block 25) operatively connected to the output of the ADC block 23 to receive the digital signal VD1.

The AGC block 25 is arranged to detect the digital signal VD1, and to generate the already mentioned gain control signal CS1, on the basis of the detected digital signal VD1. For example, the AGC block 25 is configured to estimate an amplitude of the amplified analog electrical signal VA2 (or, equivalently, of the analog electrical signal VA1) on the basis of the detected digital signal, and to set an appropriate value for the variable gain GV of the preamplifier, on the basis of the estimated amplitude. The AGC block 25 is then further arranged to generate a gain control signal CS1 having a value which corresponds to said appropriate value for the variable gain GV, that has been set as above described.

As shown in FIG. 2, the AGC block 25 is operatively connected to the control input CI1 of the preamplifier 22, in order to provide the gain control signal CS1.

In addition, it should be observed that the AGC block 25 is further arranged to generate the already mentioned compensation signal CS2, on the basis of the control signal CS1.

As shown in FIG. 2, the AGC block 25 is operatively connected to the control input CI2 of the compensation block 24, to provide the compensation signal CS2.

More specifically, the AGC block 25 is configured to generate the compensation signal CS2 in such a way to cause the compensation block 24 to perform the digital operation, on the digital signal VD1, that is appropriate to compensate the already mentioned variation of the digital signal VD1, resulting from the variable gain GV of the preamplifier 22.

In the following, more detailed examples on how the compensation signal CS2 is generated by the AGC block 25 will be provided.

In any case, it should be observed that, as noted above, an important aspect of the operation of the AGC block is the capability to generate the compensation signal CS2 on the basis of the gain control signal CS1, or, in other terms, to define and impose a relationship between the compensation signal CS2 and the gain control signal CS1. In fact, the variation of the digital signal VD1, to be compensated, depends on the variation of the amplified analog electrical signal VA2, which depends on the variable gain GV of the preamplifier 22, which, on its turn, depends on the gain control signal CS1.

Making reference once again to FIG. 2, the digital microphone system 2 further comprises a conversion block 26, operatively connected to the compensation block 24, to receive the compensated signal VD2.

The conversion block 26 is arranged to convert the compensated signal VD2 into a signal suitable to be provided at the output of the digital microphone device, through a signal output pin 201.

In fact, as already noted, digital microphone devices usually have a single output pin, through which only a single-bit modulated digital output signal is allowed. Moreover, the features of the digital output signal from the digital microphone must comply with specific requirements, imposed by standards or by the specifications of the electronic equipment in which the digital microphone may be included.

In general, the compensated digital signal VD2, at the output of the compensation block 24, does not comply with the abovementioned specific requirements. Therefore, it is necessary to further process such compensated digital signal VD2, by means of the conversion block 26.

In a significant example, the output signal from the digital microphone is a single-bit Pulse Density Modulation (PDM) signal.

In this case, the conversion block 26 is configured to convert the compensated digital signal VD2 (which can be, typically, a multi-bit signal) into a corresponding single-bit PDM signal VD3. Moreover, the conversion block 26 is operatively connected to the signal output pin 201 to provide the single bit PDM signal VD3.

A more detailed description of an embodiment of the digital microphone device, according to the disclosure, is reported in the following, with reference to FIG. 3.

The digital microphone device 3 illustrated in FIG. 3 is the same as the digital microphone device 2, already described, at a more general functional level, with reference to FIG. 2. Some of the blocks of the digital microphone are described with more details here below, for the present embodiment.

The ADC block (having reference number 33 in FIG. 3) is a single-bit Sigma-Delta Analog-to-Digital Converter.

For example, the ADC block 33 can be a single-bit Sigma-Delta PDM ADC, arranged to convert the amplified analog electrical signal VA2 into a Pulse Density Modulated (PDM) digital signal VD1. The PDM digital signal VD1 therefore consists of a single stream of bits, wherein the density of logical "1s", with respect to logical "0s", is proportional to the amplitude of the analog signal to be modulated (i.e., the amplified electrical analog signal VA2).

In particular, as an example, the ADC block 33 can be a fourth-order Sigma-Delta PDM ADC, composed for example by four stages.

It should be noted again that, in different alternative embodiments of the disclosure, different types of ADC blocks can be comprised in the digital microphone device, instead of the mentioned Sigma-Delta PDM ADC.

The AGC block, indicated in FIG. 3 by the reference number 35, comprises an amplitude detector 351, a processing block 352 and a digital delay block 353.

The amplitude detector 351 is operatively connected to the output of the ADC block 33 to receive the digital signal VD1. The amplitude detector 351 is arranged to detect the digital signal VD1 and to estimate an amplitude level (or, simply, "amplitude") of the amplified analog electrical signal VA2, on the basis of the detected digital signal VD1.

The amplitude detector 351 is implemented, for example, by means of a low pass filter combined with an envelope detector, i.e., by elements per se known. In fact, by means of such arrangement, it is possible to reconstruct, from the detected digital signal, the analog signal as it is before the PDM conversion, and to estimate its amplitude with a precision sufficient for the present purposes.

In particular, the amplitude peak of the amplified analog electrical signal VA2 can be estimated.

In the AGC block 35, the amplitude detector 351 is operatively connected to the processing block 352, to provide the estimated amplitude and/or peak amplitude.

It should be noted that the processing block 352 can be implemented by means of an integrated micro-processor communicating with one or more memories. In an alternative embodiment, the processing block 352 can be realized as a digital logic circuit.

It should be observed that the processing block 352 is arranged to generate the gain control signal CS1 on the basis of said estimated amplitude and/or peak amplitude. Advantageously, the current value of preamplifier gain GV is stored in the processing block 352, so that the processing block 352 can also estimate the amplitude and/or peak amplitude of the analog electrical signal VA1, at the input of the preamplifier, on the basis of said estimated amplitude and/or peak amplitude. Thus, the estimated amplitude (also indicated in the following as "estimated analog signal amplitude"), on the basis of which the processing block 352 determines the gain control signal CS1, can be any one among the amplitude and/or peak amplitude of either the analog electrical signal VA1 or the amplified analog electrical signal VA2.

Therefore, the processing block 352 is configured to control the variable gain GV and to change it, depending on the estimated analog signal amplitude, according to a control strategy, based on a predefined relationship between the variable gain GV, to be imposed to the preamplifier, and the estimated analog signal amplitude.

Advantageously, said relationship is established with respect to one or more thresholds (defined according to the type of estimated amplitude on the basis of which the gain control signal CS1 is set). In this case, the value of such one or more thresholds is stored in the processing block 352.

Possible gain control strategies, implemented by the processing block 352, will be further described in the following, while describing the operational behavior of the digital microphone device. It is anticipated here that the basic idea behind such control strategies is to increase the gain when the signal is below a certain low threshold, or decrease the gain when the signal is above a certain high threshold, or both.

If the variable gain GV of the preamplifier is expressed according to the previously indicated eq. (1), it can be also stated that the processing block 352 is configured to determine the analog gain factor GA, on the basis of the estimated analog signal amplitude, and to generate a corresponding gain control signal CS1. The "gain control signal CS1" corresponding to a "specific analog gain factor GA" is that specific control signal which is interpreted by the preamplifier as a command to set that specific analog gain factor GA, in order to obtain a specific value of variable gain GV.

As illustrated in FIG. 3, the processing block 352 is operatively connected to the control input CI1 of the preamplifier 22 to provide the gain control signal CS1.

In addition to the above, the processing block 352 is arranged to further determine a digital gain factor GD, on the basis of the determined analog gain factor GA, and to generate a correspondent multi-bit digital gain signal GD, representing the digital gain factor value. Typically a 5-bit word can be used for this purpose.

It should be observed that the digital gain factor GD directly depends on the analog gain factor GA, and therefore indirectly depends also on the estimated analog signal amplitude.

The digital gain factor GD is determined according to a predefined relationship with the analog gain factor GA, wherein such relationship is such as to ensure that a variation of the digital signal VD1, deriving from a respective variation of the analog signal amplitude, caused by a variation of the variable gain GV, is compensated by means of the digital gain factor GD.

In the following, it will be described how the digital gain factor GD is related to the compensation signal CS2, and how the compensation is achieved.

It is anticipated here that, in order to achieve such compensation, the processing block 352 can be configured in such a way that the digital gain factor GD is, for example, the multiplicative inverse of the analog gain factor GA.

With reference again to FIG. 3, the processing block 352 is operatively connected to the digital delay block 353, to provide the multi-bit digital gain signal GD, representing the digital gain factor GD.

Said digital delay block 353 can be implemented by means of ordinary digital circuit technology.

The digital delay block 353 is arranged to delay the multi-bit digital gain signal GD, by a predefined delay, in order to generate the compensation signal CS2.

Such predefined delay is equal to the group delay, introduced by an ADC path between the preamplifier output and the input to the compensation block 34.

Therefore, the compensation signal CS2 is equal to the multi-bit digital gain signal GD, delayed by said predefined delay.

The digital delay block 353 is operatively connected to the compensation block 34, to provide the generated compensation signal CS2.

Consequently, due to introduction of the predefined delay, any action by the compensation signal CS2, on the digital signal VD1 to be compensated, is performed just at the time instant in which the respective variation to be compensated, due to the variable gain GV, occurs at the compensation block 34, after having been propagated, with said group delay, from the preamplifier output and the input to the compensation block 34.

The compensation block 34, in the embodiment described in FIG. 3, is a digital multiplier block 34, arranged to carry out a digital multiplication between the digital signal VD1 and the compensation signal CS2: therefore, the digital operation performed on the digital signal is a digital multiplication.

It should be noted that, in the functional diagram reported in FIG. 3, single lines are used to indicate the input and output of the digital multiplier block 34.

From the point of view of the circuit structure, however, it should be observed that the control input CI2 of the multiplier block 34 may be a parallel multi-bit input (e.g., a 5-bit input), consistently with the fact that the compensation signal CS2 carries a multiplicative factor GD represented by a multi-bit (e.g., 5 bit) digital word.

The signal input VD1 is, in this case, a single-bit PDM digital signal, as already explained.

Consequently, in this example, the output from the multiplier block 34 is a multi-bit output signal, represented by n+1 (e.g., 5+1=6) parallel bits.

Therefore, the compensated signal VD2, in the form of a multi-bit (e.g., 6-bit) digital signal, is provided to the conversion block, indicated in FIG. 3 with the reference number 36. In this embodiment, the conversion block 36 is a Sigma-Delta modulator 36, arranged to convert the multi-bit compensated signal VD2 into the single-bit PDM output signal VD3.

The single-bit PDM output signal VD3 is finally provided to the output PDM pin 201.

With reference again to FIG. 3, it can be observed that the digital microphone device 3 further comprises a microphone biasing circuit 37, per se known.

The digital microphone device 3 also comprises a supply input pin 202 and a ground pin 204, necessary for power supply functions, and a clock input pin 203, arranged to receive a clock signal necessary for the operation of the whole device.

A further embodiment of the digital microphone according to the disclosure is illustrated in FIG. 4.

The digital microphone device 4 is the same as the digital microphone device 3 of FIG. 3, as far as the corresponding functional blocks indicated with the same reference numbers are concerned. The differences are related to the ADC block 43, the digital signal VD1' and the digital multiplier 44.

In fact, in the embodiment of FIG. 4, the ADC block 43 is a multi-bit Sigma-Delta ADC 43, for example a multi-bit time-continuous Sigma-Delta ADC 43.

Accordingly, the digital signal VD 1' is a multi-bit signal, represented by m bits, and not a single-bit PDM digital signal.

Consequently, the digital multiplier 44 has an m-bit signal input, an n-bit control input and a m+n bit output signal VD2.

For all the other functional and structural aspects, as already noted, the digital microphone in FIG. 4 is the same as the digital microphone in FIG. 3.

The solution adopted in this embodiment is made possible by the fact that the digital microphone, according to the present disclosure, comprises the conversion block 36 (e.g., a Sigma-Delta modulator 36), arranged to convert a multi-bit signal into a single-bit PDM output signal.

The embodiment of FIG. 4 may be advantageous, because a multi-bit Sigma-Delta ADC is typically simpler and cheaper than a single-bit Sigma-Delta ADC.

Taking the above considerations into account, the behavior of the digital microphone device of the present disclosure is described below, with particular reference to the embodiment of FIG. 3.

An acoustic signal is detected and converted into an analog electrical signal VA1, by the microphone 21.

A range of analog electrical signal VA1 values, which allows correct operation of the digital microphone, can be defined as "dynamic range" of the device. Such dynamic range is limited by a "minimum acceptable input value" VA1min, that may be related to the noise characteristics of the device, and a "maximum acceptable input value" VA1max, that may be related to the saturation characteristics of the preamplifier and/or to the maximum acceptable level at the ADC block input.

The analog electrical signal VA1 is amplified, by the preamplifier 22, and the resulting amplified analog electrical signal VA2 is converted, by means of the ADC block 33, into a respective digital signal VD1.

The preamplifier 22, as already explained, has a variable gain GV=GF*GA, wherein, GF is a fixed nominal gain value, and GA is an analog gain factor, depending on a gain control signal CS1, present at the control input CI1 of the preamplifier 22.

Let us now assume that, at a given time, the preamplifier gain has its nominal value GF, i.e., a situation in which GA=1.

Let us also assume that the nominal value GF has been set by taking into account the "maximum acceptable input value" VA1max, which may be, in a typical example, 1 V rms (root-mean-square). Therefore, the criterion to set GF is, in this case, that the preamplifier, with gain GF, is not saturated when its input is VA1max, and that the resulting amplified signal value GF*VA1max can be handled as an acceptable input signal by the ADC block.

If the gain value were fixed at GF, in any condition, the resulting "minimum acceptable input value" VA1min would be mainly dictated by the input equivalent noise of the ADC block 35, which may be, in a typical example, 30 µV rms.

The numerical examples reported above would lead to a dynamic range of 90 dB, which can be considered as a typical performance of a prior art digital microphone having a fixed gain path.

Advantageously, the digital microphone of the present disclosure allows to change, in a controlled way, the preamplifier gain GV.

In the above reported example, it particularly advantageous to raise the preamplifier gain when the amplitude of the analog input signal is low, i.e., more specifically, when it goes below a low threshold, close or equal to the minimum acceptable input value VA1min.

In fact, in these conditions, the increase of the preamplifier gain, within certain limits, does not cause problems of preamplifier saturation; on the other hand, a larger gain allows to raise the level of the amplified analog electrical signal VA2 at the input of the ADC block 33, even when the analog electrical signal VA1 is small. This implies that the minimum acceptable input value VA1min is mainly dictated, in this case, by the input equivalent noise of the preamplifier 22 (which may be, in a typical example, about 2 µV rms), rather than by the input equivalent noise of the ADC block 33 (which is typically larger, as already reported).

Consequently, in the example above, the achievable dynamic range is up to 110 dB, which is 20 dB better than the abovementioned typical performance of prior art solutions having a fixed gain path.

The improvement is obtained by using a variable gain preamplifier 22, and by controlling it in an appropriate way, as above described.

In particular, the improvement is obtained in the digital microphone of the present disclosure by providing to the preamplifier 22 a control signal CS1, which is equivalent to a command to multiply the gain by the analog gain factor GA, which is depending on the actual amplitude of the input signal.

In order to perform the abovementioned function, the digital microphone device of the present disclosure comprises an Automatic Gain Control loop, which is implemented, in particular, by the AGC block 35.

It should be observed that the AGC loop is realized by acting in the analog domain on the basis of information detected and estimated in the digital domain, exploiting the fact that the digital signal VD1 reflects, in the digital domain, the variations caused by the preamplifier gain variations on the amplified electrical analog signal VA2, in the analog domain.

In order to implement the AGC loop, the AGC block 35 detects the digital signal VD1 and estimates (by means of the amplitude detector 351) an amplitude level of the amplified electrical signal VA2. For example, in the embodiment here described, the peak amplitude level of the amplified electrical signal VA2 is detected.

Then, the AGC block 35, by means of the processing block 352, also estimates the peak amplitude of the electrical signal VA1 (that is, in this case, the "estimated amplitude"), which can be derived from the peak amplitude of the amplified electrical signal VA2 divided by the current value of the preamplifier gain.

Further, the AGC block 35, by means of the processing block 352, compares the estimated amplitude with a predefined low threshold, and, when the estimated amplitude is below said low threshold, sets a proper value for the analog gain factor GA and generates a correspondent control signal CS1.

In a similar way, the analog gain factor GA is restored to the value of 1, when the estimated amplitude returns above the predefined low threshold.

It can be easily understood by the skilled person that the exemplary Automatic Gain Control strategy above described can be easily generalized under several aspects, without departing from the scope of the present disclosure.

For example, it is possible to set a nominal fixed gain value suitable to work well for low input signal amplitudes (e.g., close to the minimum acceptable input value VA1min) and reduce the variable gain, by means of an analog gain factor GA<1, when the estimated amplitude goes above a certain high threshold.

It is also possible to set a nominal fixed gain value suitable to work well for a certain intermediate input signal amplitude, between the minimum and the maximum acceptable input values, and to set both a low threshold and a high threshold, in such a way that the variable gain is kept at the nominal fixed value when the estimated amplitude is between the low threshold and the high threshold, and the gain is increased and decreased when the estimated amplitude is, respectively, below the low threshold and above the high threshold.

It is also possible to implement further different relationships between the estimated amplitude and the analog gain factor, e.g., a relationship in which the variation of analog gain factor, depending on the estimated amplitude, is described by means of a continuous mathematical function corresponding to an inverse proportionality.

As already noted, the estimated amplitude may be referred either to the amplified analog electrical signal or to the analog electrical signal (wherein thresholds are set accordingly). Moreover, the estimated amplitude may be referred either to a peak amplitude or to an instantaneous amplitude.

After having considered the AGC loop, it should be observed that the digital signal VD1 represents, in the digital domain, a distorted version of the original input analog electrical signal VA1, due to the fact that the gain, experienced by such signal VA1 when passing through the preamplifier 22, is variable.

It is therefore important to restore a digital signal representing the original input analog electrical signal VA1.

For this purpose, a variation of the digital signal VD1, resulting from the variable gain GV of the preamplifier 22, is compensated by means of the compensation block 24. In particular, the compensation block 24 performs a digital operation on the digital signal VD1, on the basis of the compensation signal CS2, present at the control input CI2 of the compensation block 24, in such a way to generate a compensated signal VD2, representing the original input analog electrical signal VA1.

It should be emphasized that, in the digital microphone device of the present disclosure, the compensation is controlled and performed internally.

This feature has the clear advantage of avoiding an external gain control loop. This aspect is particularly significant digital microphone devices, which in general should comply with strict requirement about the number of terminals, and where it could be not possible to provide input/control pins necessary for the implementation of any external control loop.

Moreover, the compensation is carried out on the basis of available information about the gain variations (i.e., GA). Consequently, the compensation is harmonized with the gain variations. Even more, the effect of the compensation is synchronized with the effect of the gain variations, by means of the digital delay block 353, as already previously described.

In other terms, the compensation signal CS2 depends on the control signal CS1, in such a way that an effect caused on the digital signal VD1 by a gain variation, due to the control signal CS1, is counterbalanced by a related effect caused by the digital operation performed by the compensation block 34, due to the compensation signal CS2.

In order to achieve such results, the compensation signal CS2 is generated by the same AGC block 35, that generates the control signal CS1, according to an appropriate relationship between the compensation signal CS2 and the control signal CS1.

In the embodiment of FIG. 3 (and also in the embodiment of FIG. 4), the digital operation performed on the digital signal VD1 is a digital multiplication. Therefore, if the control signal CS1 corresponds to a multiplication of the variable gain GV by a gain analog factor GA, then the compensation signal CS2 is a digital multiplicative signal representing a digital gain factor GD, wherein:

$$GD = 1/GA \quad (2)$$

The generation of the analog gain factor GA and the digital gain factor GD, by the processing block 352, can be substantially simultaneous.

The control signal CS1 can be generated immediately after the generation of the analog gain factor GA.

On the contrary, the compensation signal CS2 is generated, on the basis of the digital gain factor GD, after the digital delay block 353, and is therefore delayed in such a way that, as already explained, the effect of compensation occurs at the right time.

Let us assume that, at a given time, on the basis of an estimated analog signal amplitude, the analog gain factor GA is changed from a value 1 to a value 10. Let us also assume that the digital signal is a PDM signal VD1. After the change of the analog gain factor GA from 1 to 10, the digital signal VD1 actually represents an analog signal that is 10 times larger than the original input analog signal (which implies that the density of pulses representing logical 1s is accordingly larger). In the time instant at which such digital signal VD1 arrives at the input at the multiplier block 34, the control input of the multiplier block receives the compensation signal CS2, i.e., the digital gain factor GD, having a value of 0.1 calculated according to eq. (2), in the form of a multi-bit word. Therefore, the PDM digital signal VD1 is digitally multiplied by GD=0.1, thus generating a compensated signal VD2, in the form of a multi-bit digital signal.

Finally, as already explained, such multi-bit digital signal VD2 is converted into the single-bit PDM output signal VD3, by means of a Sigma-Delta modulator 36, playing the role of conversion block.

Figure 5:
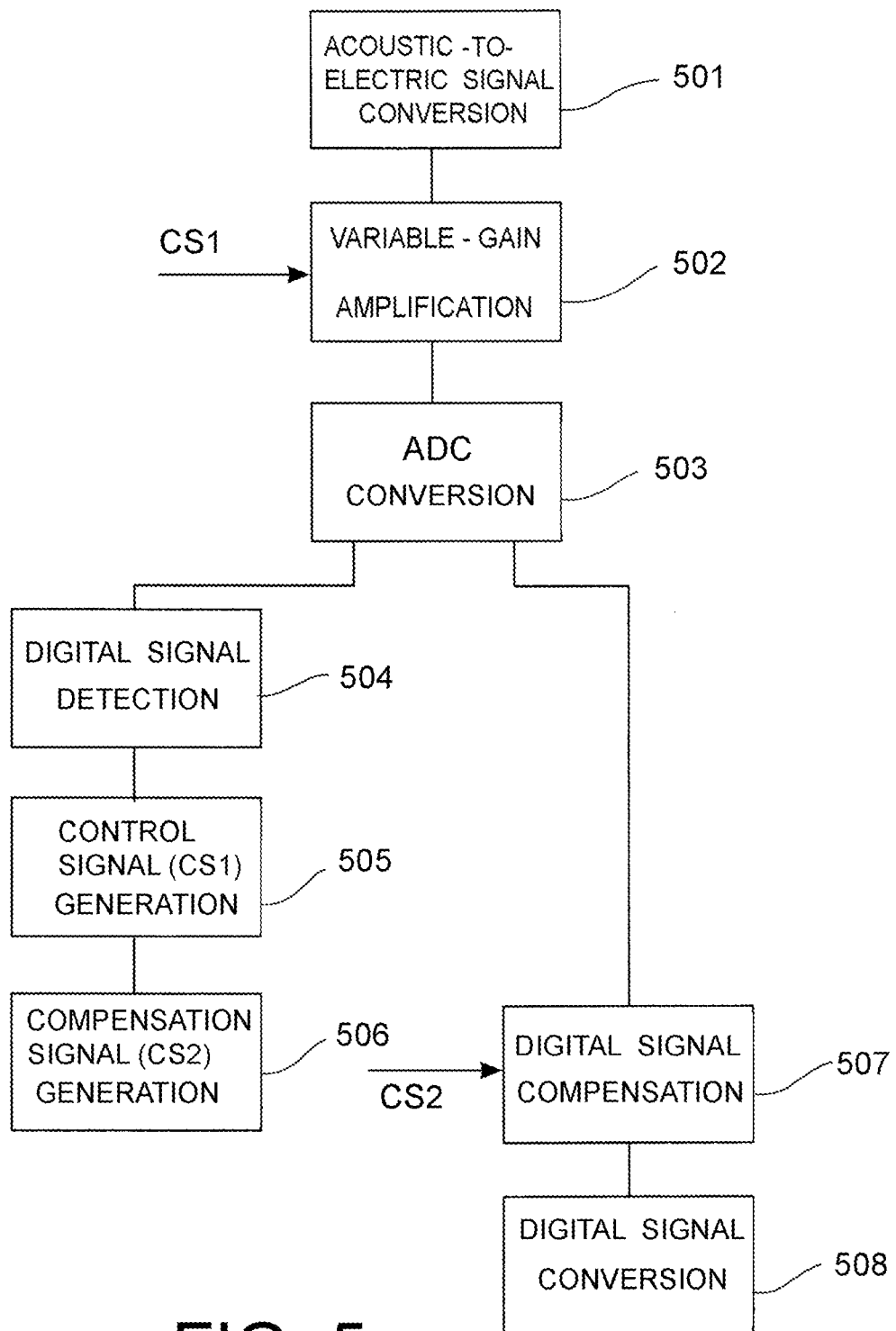
FIG. 5 is a flow diagram illustrating a method for providing a single-bit PDM output signal at an output of a digital microphone device, according to the disclosure.

A method for providing a single-bit Pulse Density Modulation PDM output signal at an output of a digital microphone device, according to the present disclosure, and according to the above described working behavior, is described below, with reference to FIG. 5.

The method comprises, firstly, a step of converting 501 an acoustic input signal into an analog electrical signal VA1, by means of a microphone; then, a step of amplifying 502 the analog electrical signal VA1, by means of a preamplifier having a variable gain GV depending on a gain control signal CS1, in order to generate an amplified analog electrical signal VA2, depending on the variable gain GV.

The method further comprises a step of converting 503 the amplified analog electrical signal VA2 into a respective digital signal VD1, by means of an Analog-to-Digital Converter block.

Then, the method comprises a step of detecting 504 the digital signal VD1, by means of an Automatic Gain Controller block.

Furthermore, the method comprises the step of generating 505 the gain control signal CS1, by the Automatic Gain Controller block, on the basis of the detected digital signal VD1, providing the gain control signal CS1 to the pre-amplifier. It should be noted that the output of the step of generating 505 influences the step of amplifying 502, as already described, which is symbolically represented in FIG. 5 by the arrow CS 1 pointing on the rectangle of the step 502.

The method according to the disclosure further comprises a step of generating 506 a compensation signal CS2, by the Automatic Gain Controller block, on the basis of the control signal CS1, providing the compensation signal CS2 to a compensation block.

Then, the method comprises a step of compensating 507 a variation of the digital signal VD1, resulting from the variable gain GV of the preamplifier, by performing, by means of the compensation block, a digital operation on the digital signal VD1, on the basis of the compensation signal CS2, so as to generate a compensated signal VD2. It should be noted that the output of the step of generating 506 influences the step of compensating 507, as already described, which is symbolically represented in FIG. 5 by the arrow CS2 pointing on the rectangle corresponding to step 507.

Finally, the method comprises a step of converting 508 the compensated signal VD2 into the single-bit PDM output signal VD3, by means of a conversion block.

From the above reported description, it can be concluded that the object of the present disclosure is achieved by the digital microphone device above described, by virtue of its features.

In particular, the dynamic range of the digital microphone is significantly extended, as a consequence of the capability of controlling the internal path gain of the digital microphone.

Moreover, the capability of performing an internal compensation of the signal variations, due to the gain variations, advantageously allows to perform the entire operation without the need of an external control loop, which could be not possible in such devices, due to the constraints on the number of input/output terminals.

A man skilled in the art may make several changes, adjustments and replacements of elements with other functionally equivalent ones to the embodiments of the device and method described above, also jointly with the prior art, creating hybrid implementations, in order to meet incidental adjustments, without departing from the scope of the following claims. Each of the features described as belonging to a possible embodiment can be obtained independently of the other embodiments described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
a digital microphone device configured to provide a single-bit Pulse Density Modulation (PDM) output signal the device including:
  a microphone configured to convert an acoustic input signal into an analog electrical signal;
  a preamplifier, having a variable gain based on a gain control signal, the preamplifier being configured to receive the analog electrical signal and to provide an amplified analog electrical signal that depends on the variable gain;
  an Analog-to-Digital Converter, configured to receive the amplified analog electrical signal and to provide a digital signal;
  a compensation circuit, configured to receive the digital signal, to perform a digital operation on the digital signal, and based on a compensation signal generate a compensated signal;
  an Automatic Gain Controller, configured to detect the digital signal, to generate said gain control signal based on the detected digital signal, and to output the gain control signal to the preamplifier, the Automatic Gain Controller block configured to generate said compensation signal based on the gain control signal, and to provide the compensation signal to the compensation block, to compensate a variation of the digital signal resulting from the variable gain of the preamplifier; and
  a conversion circuit, configured to receive the compensated signal and to convert it into the single-bit PDM output signal.

2. The apparatus according to claim 1, wherein the Analog-to-Digital Converter is a single-bit Sigma-Delta analog-to-digital converter.

3. The apparatus according to claim 1, wherein the Analog-to-Digital Converter is a multi-bit time-continuous Sigma-Delta analog-to-digital converter.

4. The apparatus according to claim 1, wherein the compensated signal is a multi-bit signal and the conversion circuit is a Sigma-Delta modulator, configured to convert the multi-bit compensated signal into the single-bit PDM output signal.

5. The apparatus according to claim 1, wherein the variable gain is based on a fixed gain multiplied by an analog gain factor, the analog gain factor corresponding to a respective value of the gain control signal.

6. The apparatus according to claim 5, wherein the compensation signal depends on a digital gain factor.

7. The apparatus according to claim 6, wherein the Automatic Gain Controller block comprises:
an amplitude detector, configured to estimate an amplitude level of the amplified analog electrical signal based on the detected digital signal;
and a processer, configured to determine the analog gain factor and the digital gain factor based on the estimated amplitude level, the digital gain factor being the multiplicative inverse of the analog gain factor;
wherein the processer is further configured to generate, at a first output, the gain control signal, having a value corresponding to the determined analog gain factor, and to generate, at a second output, a multi-bit digital gain signal representing the digital gain factor.

8. The apparatus according to claim 7, wherein the Automatic Gain Controller further comprises a digital delay block, configured to receive said digital gain signal and to generate a delayed digital gain signal, having a delay, with respect to said digital gain signal, equal to a group delay introduced by an analog-to-digital conversion path between the preamplifier output and an input of the compensation block.

9. The apparatus according to claim 8, wherein the compensation signal is the delayed digital gain signal.

10. The apparatus according to claim 9, wherein the Automatic Gain Controller is operatively connected to the preamplifier to provide said gain control signal, present at the first output of the processing block, and is operatively connected to the compensation block to provide said delayed digital gain signal, generated by the digital delay block.

11. The apparatus according to claim 10, wherein the compensation circuit is a digital multiplier circuit, and the digital operation on the digital signal is a digital multiplication of the digital signal by the compensation signal.

12. The apparatus according to claim 1, further comprising a microphone biasing circuit.

13. The apparatus according to claim 1, further comprising a supply input pin, a clock input pin, a ground pin, and wherein the output for a single-bit PDM output signal is an output PDM pin.

14. A method, comprising:
providing a single-bit Pulse Density Modulation (PDM) output signal at an output of a digital microphone device, the providing including:
converting an acoustic input signal into an analog electrical signal with a microphone;
amplifying said analog electrical signal with a preamplifier having a variable gain depending on a gain control signal;
generating an amplified analog electrical signal that depends on the variable gain;
converting the amplified analog electrical signal into a respective digital signal with an Analog-to-Digital Converter;
detecting said digital signal with an Automatic Gain Controller;
generating, by the Automatic Gain Controller, said gain control signal based on the detected digital signal;
outputting, by the Automatic Gain Controller block, the gain control signal to the preamplifier;
generating, by the Automatic Gain Controller, a compensation signal based on the gain control signal, and providing the compensation signal to a compensation circuit;
compensating a variation of the digital signal with the compensation circuit, resulting from the variable gain of the preamplifier, by performing a digital operation on the digital signal based on the compensation signal to generate a compensated signal;
converting, the compensated signal into the single-bit PDM output signal with a conversion circuit.

15. The method of claim 14 further comprising biasing the analog electrical signal.

16. The method of claim 14 wherein the conversion circuit is a sigma-delta modulator.

17. A device, comprising:
a microphone;
a pre-amplification circuit that receives an analog electrical signal from the microphone;
an analog to digital converter that receives an amplified analog electrical signal from the pre-amplification circuit;
an automatic gain controller circuit that receives a digital signal from the analog to digital converter, the automatic gain controller being configured to output a first control signal to the pre-amplification circuit and a second control signal;
a compensation circuit that receives the digital signal and the second control signal; and
a conversion circuit that receives a compensated digital signal from the compensation circuit and outputs a pulse density modulated output signal.

18. The device of claim 17 wherein the pulse density modulated output signal is a single bit signal.

19. The device of claim 17 wherein the pre-amplification circuit has a variable gain that is based on the first control signal, the amplified analog electrical signal depending on the variable gain.

20. The device of claim 17 wherein the analog to digital converter is a single-bit Sigma-Delta analog-to-digital converter.

* * * * *